(12) United States Patent
Shirotori et al.

(10) Patent No.: US 6,578,179 B2
(45) Date of Patent: Jun. 10, 2003

(54) LSI LAYOUT DESIGN APPARATUS, LAYOUT DESIGN METHOD, RECORDING MEDIUM RECORDING LAYOUT DESIGN PROGRAM, AND SEMICONDUCTOR INTEGRATED CIRCUIT

(75) Inventors: Tsukasa Shirotori, Yokohama (JP); Yukihiro Urakawa, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 09/962,272

(22) Filed: Sep. 26, 2001

(65) Prior Publication Data

US 2002/0042905 A1 Apr. 11, 2002

(30) Foreign Application Priority Data

Sep. 29, 2000  (JP) .................................. 2000-301448

(51) Int. Cl.[7] .............................................. G06F 17/50
(52) U.S. Cl. ................................................ 716/3; 716/1
(58) Field of Search ........................................ 716/1–14

(56) References Cited

U.S. PATENT DOCUMENTS

| | | | | |
|---|---|---|---|---|
| 5,367,210 A | * | 11/1994 | Lipp | 326/26 |
| 5,404,311 A | | 4/1995 | Isoda | |
| 5,610,831 A | * | 3/1997 | Matsumoto | 716/19 |
| 5,974,244 A | * | 10/1999 | Hayashi et al. | 716/8 |
| 6,131,182 A | * | 10/2000 | Beakes et al. | 716/8 |
| 6,373,458 B1 | * | 4/2002 | Yamakura et al. | 345/98 |

FOREIGN PATENT DOCUMENTS

JP  5-198678  8/1993

OTHER PUBLICATIONS

Kishida et al.,"Transistor Size Optimization in Layout Design Rule Migration",May 1994, IEEE 1994 Custom Integrated Circuits Conference., Proceedings of IEEE 1994, pp. 541–544.*

* cited by examiner

*Primary Examiner*—Vuthe Siek
*Assistant Examiner*—Sun James Lin
(74) *Attorney, Agent, or Firm*—Oblon, Spivak, McClelland, Maier & Neustadt, P.C.

(57) ABSTRACT

A migration section conducting process migration for converting first layout according to a first design standard into second layout according to a second design standard and a designated transistor size; an extraction section extracting transistor sizes and parasitic capacitances from the first and the second layout; a delay calculation section calculating first delay time from the transistor size and the parasitic capacitance extracted from the first layout and a driving current value of a transistor based on the first design standard, and calculating second delay time from the transistor size and the parasitic capacitance extracted from the second layout and a driving current value of the transistor based on the second design standard; and an optimum value calculation section calculating an optimum value of the transistor size after the process migration in order that the second delay time becomes equal to the first delay time, are provided.

13 Claims, 6 Drawing Sheets

TPd = C/(Id * W)

LSI LAYOUT DESIGN APPARATUS, LAYOUT DESIGN METHOD, RECORDING MEDIUM RECORDING LAYOUT DESIGN PROGRAM, AND SEMICONDUCTOR INTEGRATED CIRCUIT

CROSS REFERENCE TO RELATED APPLICATIONS

This application claims benefit of priority under 35 USC §119 to Japanese Patent Application No. 2000-301448 filed on Sep. 29, 2000, the entire contents of which are incorporated by reference herein.

BACKGROUND OF THE INVENTION

1. Field of the Invention

The present invention relates to an LSI layout design technique and particularly pertains to an LSI design apparatus, a layout design method using process migration, a recording medium recording a layout design program, and a semiconductor integrated circuit.

2. Description of the Related Art

As a mechanism for redesigning LSI layout data designed by an existing process technique by applying a new process technique, a design rule-based automatic layout generation tool by means of process migration has been widely adopted. If using this automatic layout generation tool, it is possible to generate layout data obtained by subjecting already designed circuit diagram information to shrink or the like according to a fine design rule based on a developed process technology.

FIG. 1A shows an example of a circuit layout before process migration. FIG. 2A shows an example of a circuit layout after the process migration by which the circuit layout shown in FIG. 1A has been subjected to a shrinking processing by the above-stated generation tool. A shrink rate after the process migration is uniformly applied to a diffused layer 1 constituting the source/drain of a transistor, a gate electrode 2 and a metal wiring layer 3 constituting wirings. Also, the shape of the diagram and the relative positional relationship among the constituent elements are hardly changed before and after the process migration.

However, if attention is paid to the parasitic capacitances of the respective elements before and after the process migration, the shrink rate is not always applied to these parasitic capacitances uniformly.

FIG. 3 is a graph showing the capacitance changes of the diffused layer 1 constituting the source/drain of the transistor, the gate electrode 2 and the wirings 3 while the vertical axis of the graph indicates capacitance value and the horizontal axis thereof indicates shrink rate. If capacitance changes are observed from a point A (shrink rate=0) at which each capacitance value is an initial value, to a point B and to a point C in which order the shrink rate increases, the parasitic capacitances of the peripheral elements of the transistor, such as the diffused layer and the gate electrode 2, tend to decrease and those of the wirings 3 hardly change or tend to slightly increase. Thus, the shrink rate does not influence the wirings 3. This is because the two-dimensional areas of the wirings 3 are decreased by the shrinking processing by means of the process migration while the capacitance between the wirings is increased by shrinking a wiring distance.

FIG. 1B is a cross-sectional view of the wiring layer taken along line 5—5 of FIG. 1A. FIG. 2B is a cross-sectional view of the wiring layer taken along line 6—6 of FIG. 2A.

As can be seen from FIGS. 1B and 2B, the shrink rate by the process migration is applied to the two-dimensional direction of the wirings but hardly applied to the three-dimensional direction thereof. This is because the thickness of each wiring ((3) in FIG. 2B) cannot be made too small compared with the shrinkage of the wiring width ((1) and (2) in FIG. 1B).

Furthermore, as fine machining has been developed recently, the cross-sectional structure of a wiring tends to have a higher aspect ratio and the capacitance between wirings tends to increase.

As stated above, if attention is paid to the parasitic capacitances of the constituent elements before and after the process migration, it is seen that the relationship of the parasitic capacitances in the layout design before the process migration is not shrunk under uniform conditions. As a result, the capacitances are unbalanced on the layout after the process migration compared with the layout before the process migration.

If a size for determining the driving force of a transistor driving each node is uniformly shrunken in this state, then the balance between the driving force and the load of the transistor is destroyed by unbalanced capacitances, the relationship of operation timing which has been optimized in the capacitance distribution before the process migration is disturbed accordingly, and such problems as decreased operating speed and malfunction may possibly occur.

SUMMARY OF THE INVENTION

An LSI layout design apparatus in one embodiment according to the present invention includes: a process migration section conducting process migration for converting first layout data according to a first design standard into second layout data according to a second design standard and a designated transistor size; an extraction section extracting transistor sizes and parasitic capacitances from the first layout data and the second layout data, respectively, for each node; a delay time calculation section calculating first delay time from the transistor size and the parasitic capacitance extracted from the first layout data and a driving current value of a transistor based on the first design standard, and calculating second delay time from the transistor size and the parasitic capacitance extracted from the second layout data and a driving current value of the transistor based on the second design standard; and an optimum value calculation section calculating an optimum value of the transistor size after the process migration in order that the second delay time becomes equal to the first delay time.

In addition, according to an LSI layout design method in one embodiment according to the present invention includes: conducting process migration for designating a transistor size, and converting first layout data according to a first design standard into second layout data according to a second design standard; extracting a transistor size and a parasitic capacitance for each node from said first layout data; calculating first delay time from the transistor size and the parasitic capacitance extracted from said first layout data and a driving force of a transistor based on said first design standard; extracting a transistor size and a parasitic capacitance for each node from said second layout data; calculating second delay time from the transistor size and the parasitic capacitance extracted from said second layout data and a driving force of the transistor based on said second design standard; calculating an optimum value of the transistor size after the process migration in order that said second delay time becomes equal to said first delay time; comparing the transistor size extracted from said second layout data with said optimum value, and obtaining a differential value; and executing said process migration again based on the calculated optimum value of the transistor size if said differential value obtained as a result of comparison is out of a predetermined range.

Further, an LSI layout design program stored in a computer readable recording medium in one embodiment according to the present invention includes: conducting process migration for designating a transistor size, and converting first layout data according to a first design standard into second layout data according to a second design standard; extracting a transistor size and a parasitic capacitance for each node from said first layout data; calculating first delay time from the transistor size and the parasitic capacitance extracted from said first layout data and a driving force of a transistor based on said first design standard; extracting a transistor size and a parasitic capacitance for each node from said second layout data; calculating second delay time from the transistor size and the parasitic capacitance extracted from said second layout data and a driving force of the transistor based on said second design standard; calculating an optimum value of the transistor size after the process migration in order that said second delay time becomes equal to said first delay time; comparing the transistor size extracted from said second layout data with said optimum value, and obtaining a differential value; and executing said process migration again based on the calculated optimum value of the transistor size if said differential value obtained as a result of comparison is out of a predetermined range.

Moreover, a semiconductor integrated circuit in one embodiment according to the present invention is designed by using an LSI layout design method including: conducting process migration for designating a transistor size, and converting first layout data according to a first design standard into second layout data according to a second design standard; extracting a transistor size and a parasitic capacitance for each node from said first layout data; calculating first delay time from the transistor size and the parasitic capacitance extracted from said first layout data and a driving force of a transistor based on said first design standard; extracting a transistor size and a parasitic capacitance for each node from said second layout data; calculating second delay time from the transistor size and the parasitic capacitance extracted from said second layout data and a driving force of the transistor based on said second design standard; calculating an optimum value of the transistor size after the process migration in order that said second delay time becomes equal to said first delay time; comparing the transistor size extracted from said second layout data with said optimum value, and obtaining a differential value; and executing said process migration again based on the calculated optimum value of the transistor size if said differential value obtained as a result of comparison is out of a predetermined range.

DETAILED DESCRIPTION

The embodiment of the present invention will be described hereinafter with reference to the drawings.

Figure 4:
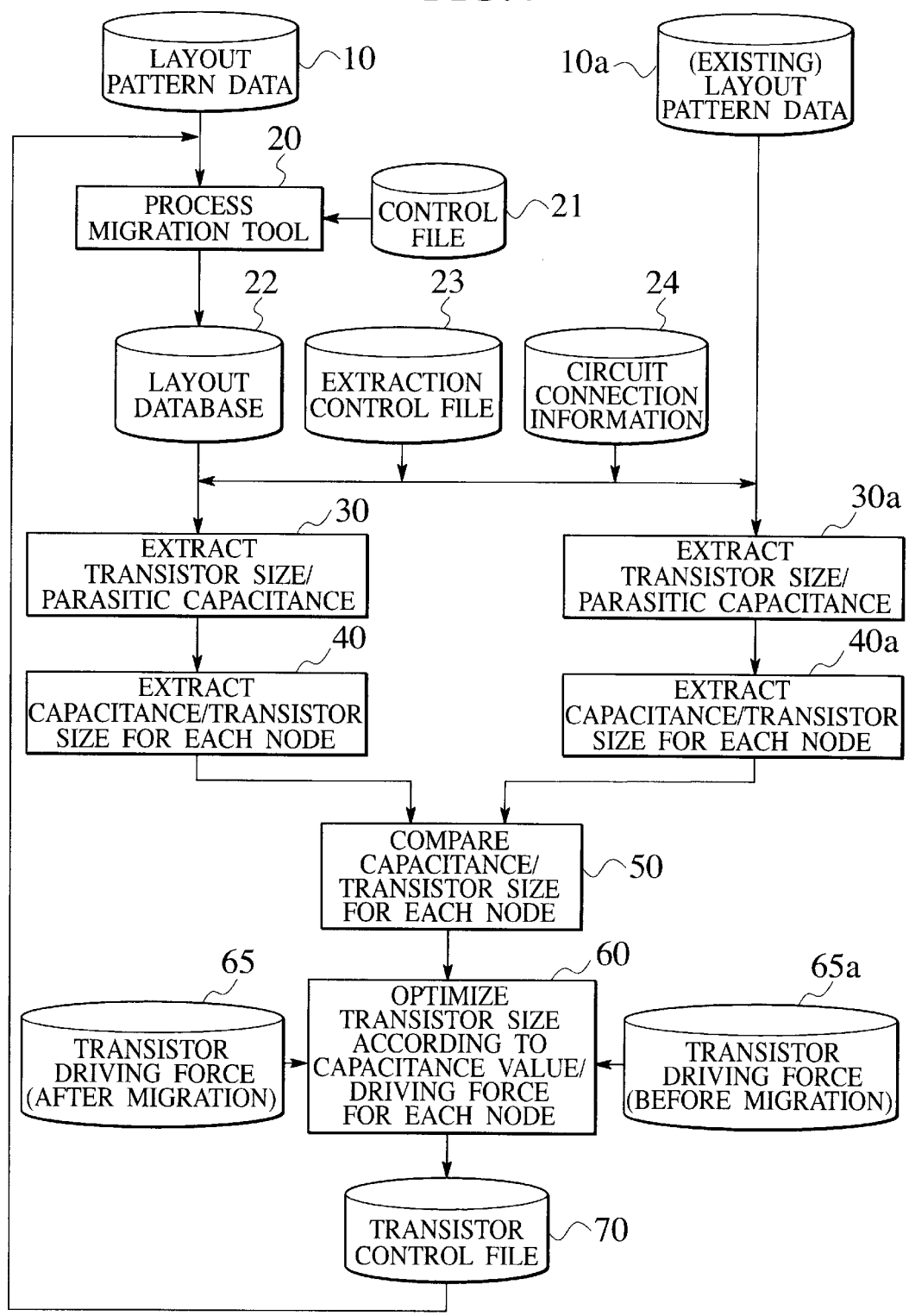
FIG. 4 is a schematic block diagram of an LSI layout design apparatus in one embodiment according to the present invention.

FIG. 4 shows an LSI layout design apparatus in one embodiment according to the present invention.

In FIG. 4, layout pattern data 10 serving as a source is layout data on an LSI designed by an existing process technique and the operation timing of each node included in this layout is optimized according to the capacitance distribution thereof.

A process migration tool 20 inputs the layout pattern data 10 and executes a migration processing in accordance with a design rule stored in a control file 21.

The control file 21 stores a process parameter for controlling the migration and fine design rules by a developed process technology including, for example, a minimum wiring width and a minimum wiring distance. The process migration tool 20 converts the inputted layout pattern data 10 into a desired design with reference to this process parameter and outputs the desired design to a layout database 22.

Figure 1A:
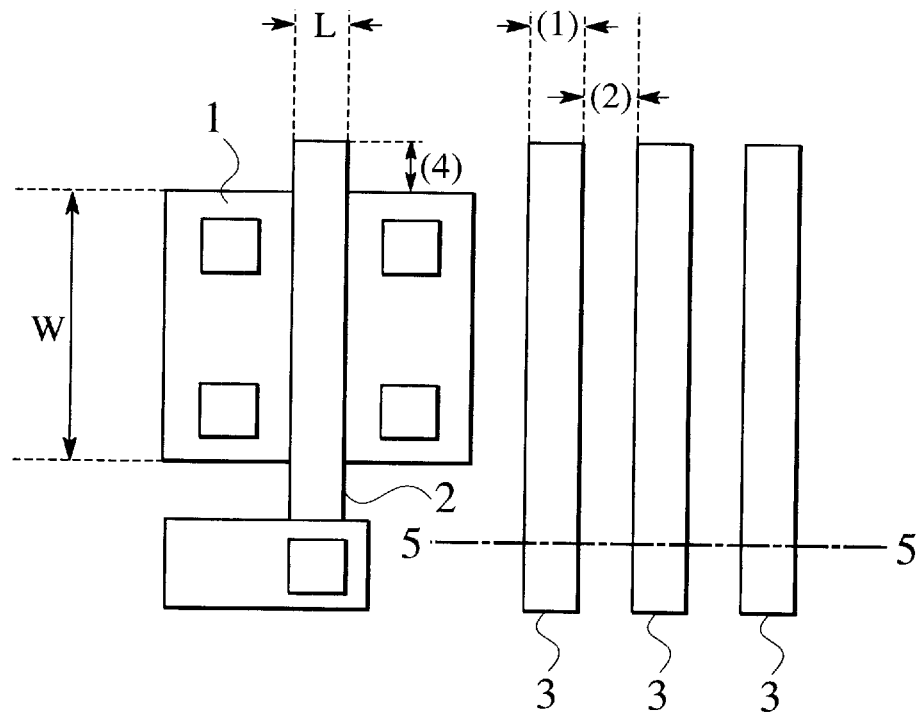
FIG. 1A shows a circuit layout before ordinary process migration is conducted.
Figure 1B:
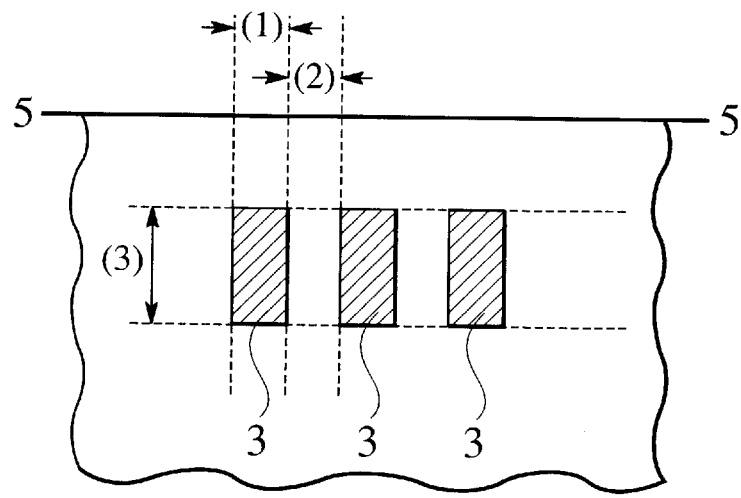
FIG. 1B is a cross-sectional view taken along line 5—5 of FIG. 1A.
Figure 2A:
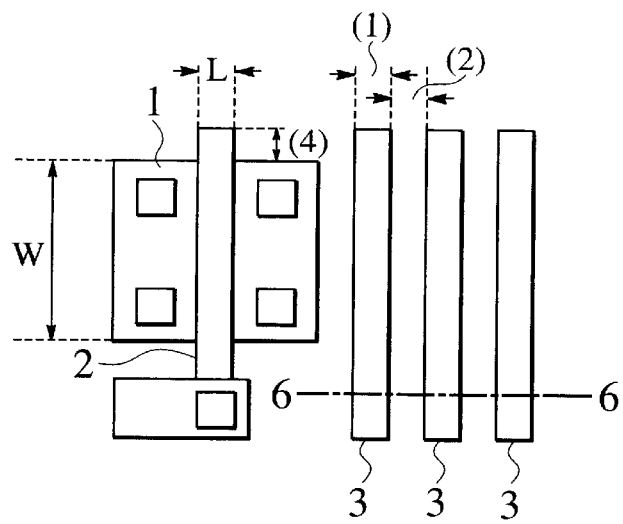
FIG. 2A shows a circuit layout after the ordinary process migration is conducted.
Figure 2B:
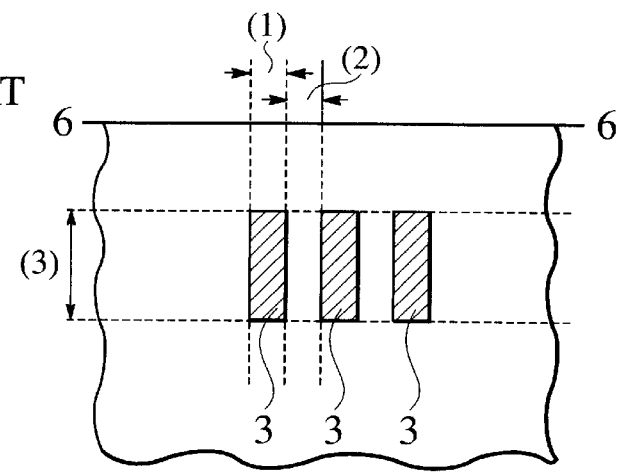
FIG. 2B is a cross-sectional view taken along line 6—6 of FIG. 2A.
Figure 3:
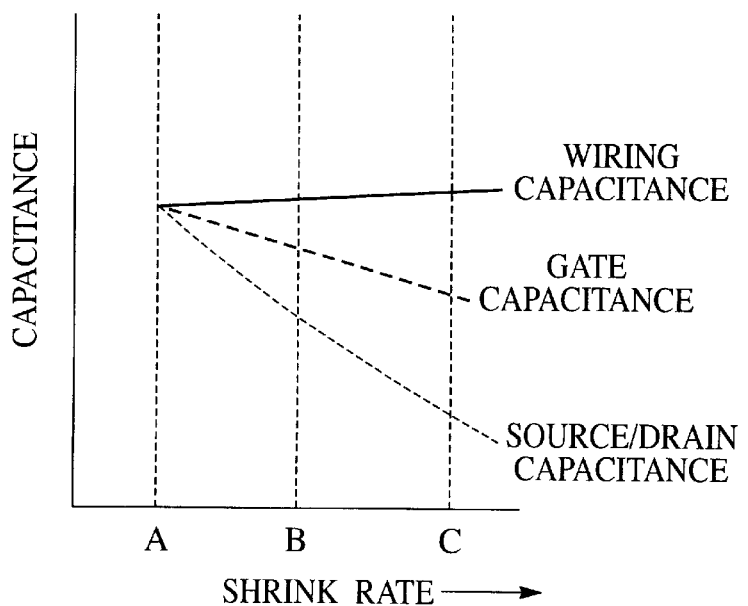
FIG. 3 is a graph showing the changes of the parasitic capacitances of respective constituent elements by the ordinary process migration.

When executing the migration tool 20, the desired sizes of respective transistors (e.g., a gate length L and a gate width W of a gate constituting the transistor shown in FIG. 2A) can be individually designated and stored in the transistor size control file 70. In an initial migration processing, appropriate values might be designated as the values of the transistor sizes. If the values are the averages of shrunken values of various design rules by the migration processing, it is possible to enhance the efficiency of an optimization processing which follows the initial processing.

Next, a layout parameter extraction tool 30 extracts the values including transistor sizes, parasitic capacitances and the like from the layout database 22 after the migration processing in accordance with extraction rules stored in an extraction control file 23 and circuit connection information 24. It is noted that the extraction control file 23 stores parameters for interlayer arithmetic operation and wiring unit length for extracting the transistor sizes, the parasitic capacitances and the like from the layout database 22.

Here, information on the parasitic capacitances, the wiring capacitances, the transistor sizes and the like is information including connection information on various constituent elements based on the names of signals stored in the circuit connection information 24. Namely, according to the name of each signal on the circuit diagram, information including:

(1) the parasitic capacitance values of a wiring, a gate and a diffused layer on the signal name; and (2) the name, size and the like of a transistor driving the node of the signal;

is extracted and a database including the extracted information is formed.

Furthermore, based on the database thus formed, cross-reference (one-by-one correspondence for each node) is given according to the name of each signal using a data extraction tool 40 provided for each node, and information including:

(a) the parasitic capacitance value of each node; and (b) the size of a transistor driving the node;

is put in order and a database including the information is formed.

Meanwhile, the layout pattern data 10 used by the migration tool 20 as the source is also used as existing layout pattern data 10*a*. From this layout pattern data 10*a*, cross-reference (one-by-one correspondence for each node) is given according to the name of each signal using a layout parameter extraction tool 30*a*, which carries out the same processing as that of the layout parameter extraction tool 30 and a data extraction tool 40*a* which carries out the same processing as that of the data extraction tool 40 as described above, and information including:

(a') the parasitic capacitance value of each node; and (b') the size of a transistor driving the node;

is put in order and a database including the information is formed.

From the databases formed by these data extraction tools 40 and 40*a*, a capacitance/size comparison tool 50 picks up the parasitic capacitances and the sizes of transistors driving the corresponding nodes before and after the migration in node units.

Next, the function of a transistor size optimization tool 60 will be described. The transistor size optimization tool 60 obtains a delay time proportional function of each node before and after the migration based on the node capacitance values and the size of the transistor driving the node before and after the migration and data 65 and 65*a* on the driving forces of the transistor before and after the migration. Here, the transistor driving force data 65*a* before the migration stores driving current data on each transistor used by a process technology for the existing layout database 10*a*. The transistor driving force data 65 after the migration stores driving current data on each transistor used by a process technology applied after the migration. This database is obtained by the analysis of transistor characteristics determined by each process technology.

Figure 5A:
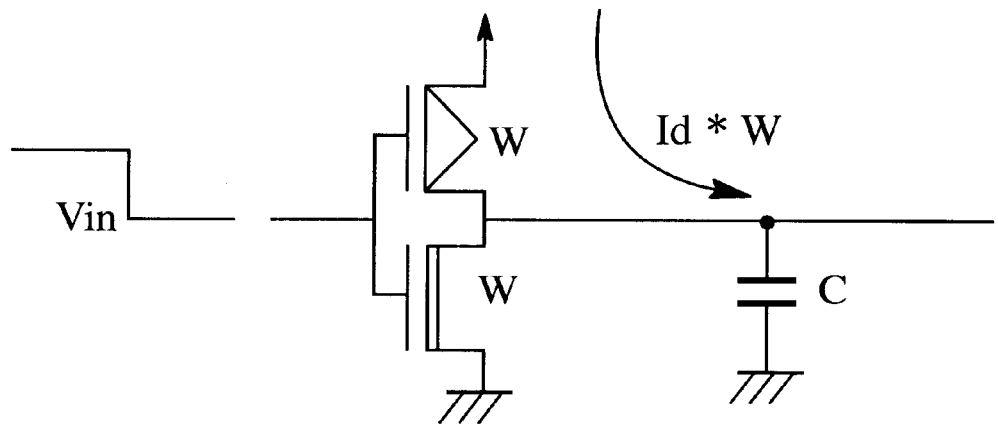
FIG. 5A is a circuit diagram for describing the relationship among driving force, load capacitance and delay time.
Figure 5B:
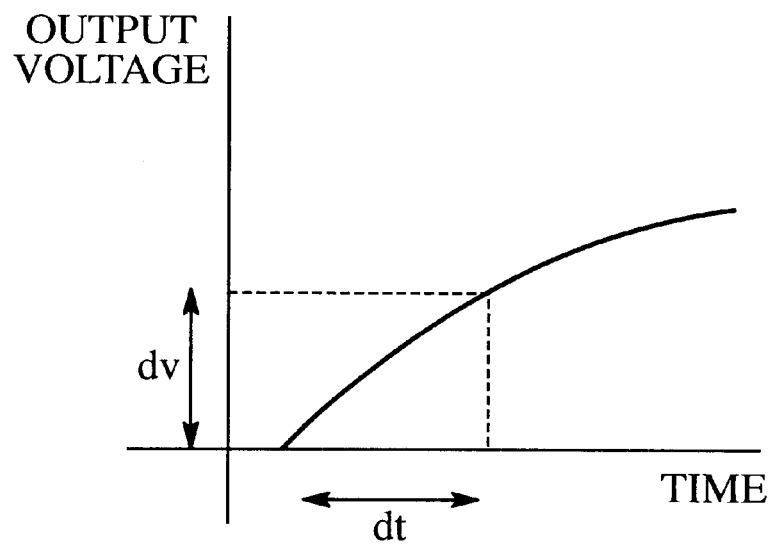
FIG. 5B is a graph for describing the relationship among driving force, load capacitance and delay time.

FIGS. 5A and 5B show the relationship among delay time, transistor driving force and load capacitance. In FIGS. 5A and 5B, reference symbol C denotes a parasitic capacitance value and Id denotes a driving current value per transistor unit W. Based on FIGS. 5A and 5B, delay time Tpd can be obtained from the following formula:

$$Tpd = C/(Id \times W) \quad (1).$$

Figure 6A:
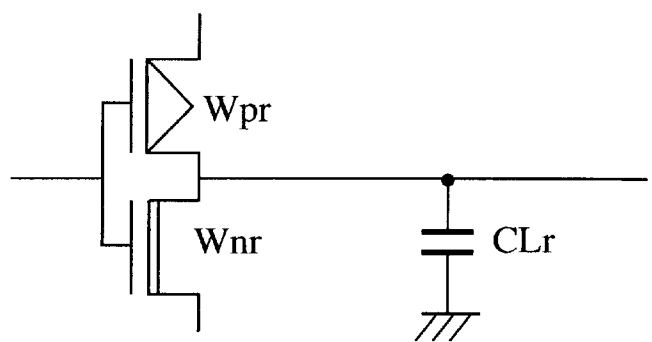
FIG. 6A is an explanatory view for the relationship between transistor size and load capacitance before the process migration.
Figure 6B:
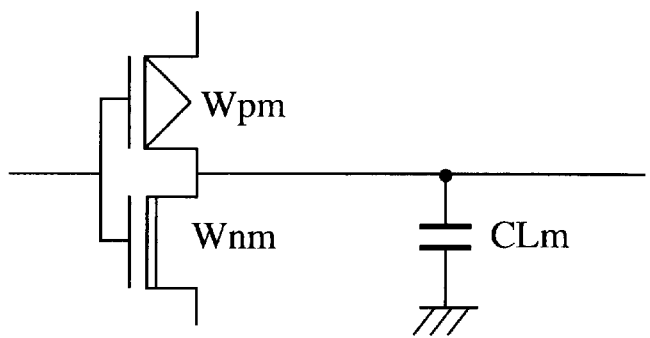
FIG. 6B is an explanatory view for the relationship between transistor size and load capacitance after the process migration.

Here, the relationship of the transistor size W before and after the migration will be described while taking FIGS. 6A and 7 as an example. FIG. 6A shows the relationship among the capacitance value CLr of a certain node and the sizes Wpr and Wnr of respective drive transistors driving the node before the migration. Delay time at that moment is expressed by a reference curve shown in FIG. 7. Also, FIG. 6B shows the relationship among the capacitance value CLm of the certain node and the sizes Wpm and Wnm of the respective drive transistors driving the node after the migration.

Figure 7:
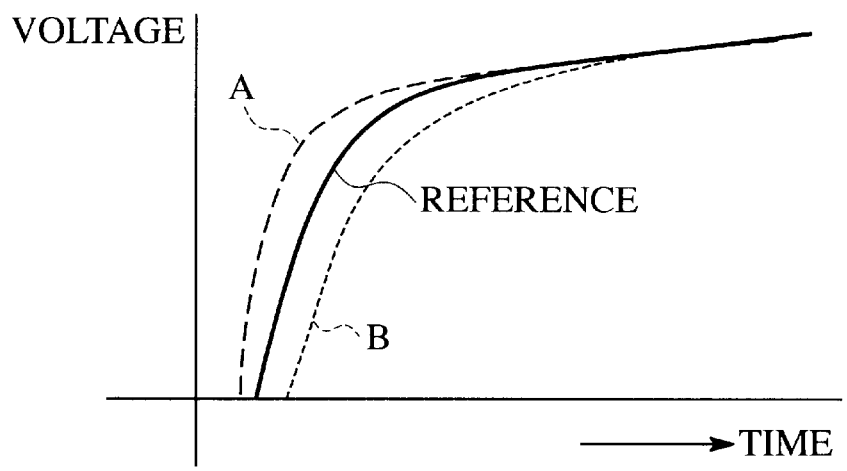
FIG. 7 is a graph showing difference in operating speed before and after the process migration.

As can be seen from the relationship among the capacitance value CLm and the transistor sizes Wpm and Wnm after the migration, if the capacitance value CLm is largely decreased by the migration processing, a delay corresponding to a curve A shown in FIG. 7 occurs and operation timing is shifted to be earlier than that of the reference. Conversely, if the capacitance between the wirings is largely increased compared with the decrease of the wiring area by the migration processing, a delay corresponding to a curve B shown in FIG. 7 occurs and operation timing is shifted to be later than that of the reference.

Considering this, the transistor size W after the migration is calculated in order that delay time Tpd before the migration becomes equal to delay time Tpd after the migration while using the parasitic capacitance values C of the certain node, driving currents Id and transistor sizes W before and after the migration.

In other words, respective elements are given as follows and delay time Tpdr before the migration and delay time Tpdm after the migration are obtained from the following formulas (2) to (3):

(a) Elements on the certain node before the migration:
(a1) parasitic capacitance value CLr;
(a2) driving current IDr; and
(a3) transisitor siz Wr, and (b) Elements on the certain node after the migration:
(b1) parasitic capacitance value CLm;
(b2) driving current IDm; and
(b3) transisitor siz Wm.

$$Tpdr = CLr/(Idr \times Wr) \quad (2),$$

and $$Tpdm = CLm/(Idm \times Wm) \quad (3).$$

Then, a transistor size Wo after the migration is obtained in order that the delay time Tpdr before the migration becomes equal to the delay time Tpdm after the migration, i.e., in order that Tpdr and Tpdm can satisfy the relationship of the following formula (4):

$$Tpdr = Tpdm \quad (4).$$

By establishing the relationship expressed by the formula (4), the operation timing of each node after the migration becomes equivalent to the operation timing of the node which has been optimized before the migration. The transistor size Wo derived here is an optimum transistor size value for the node with respect to the migration processing.

Next, comparison is made between the transistor size optimum value Wo thus obtained and the current transistor size Wm after the migration conducted by the migration tool 20. If the comparison shows that the both sizes are different, the optimum value Wo is outputted to the transistor control file 70 and a migration processing executed again by the migration tool 20 using the optimized transistor size Wo.

Further, if the delay time before the migration used as an optimization standard is used after being adjusted, then it is possible to optimize the delay time adapted after the migration. By setting the delay time before the migration to be, for example, shorter than the actual delay time before the migration, it is possible to carry out optimizations including further shortening the delay time after the migration and accelerating the speed of the overall LSI.

By repeating a series of these procedures, an intended optimized layout database 22 is eventually obtained.

Figure 8:
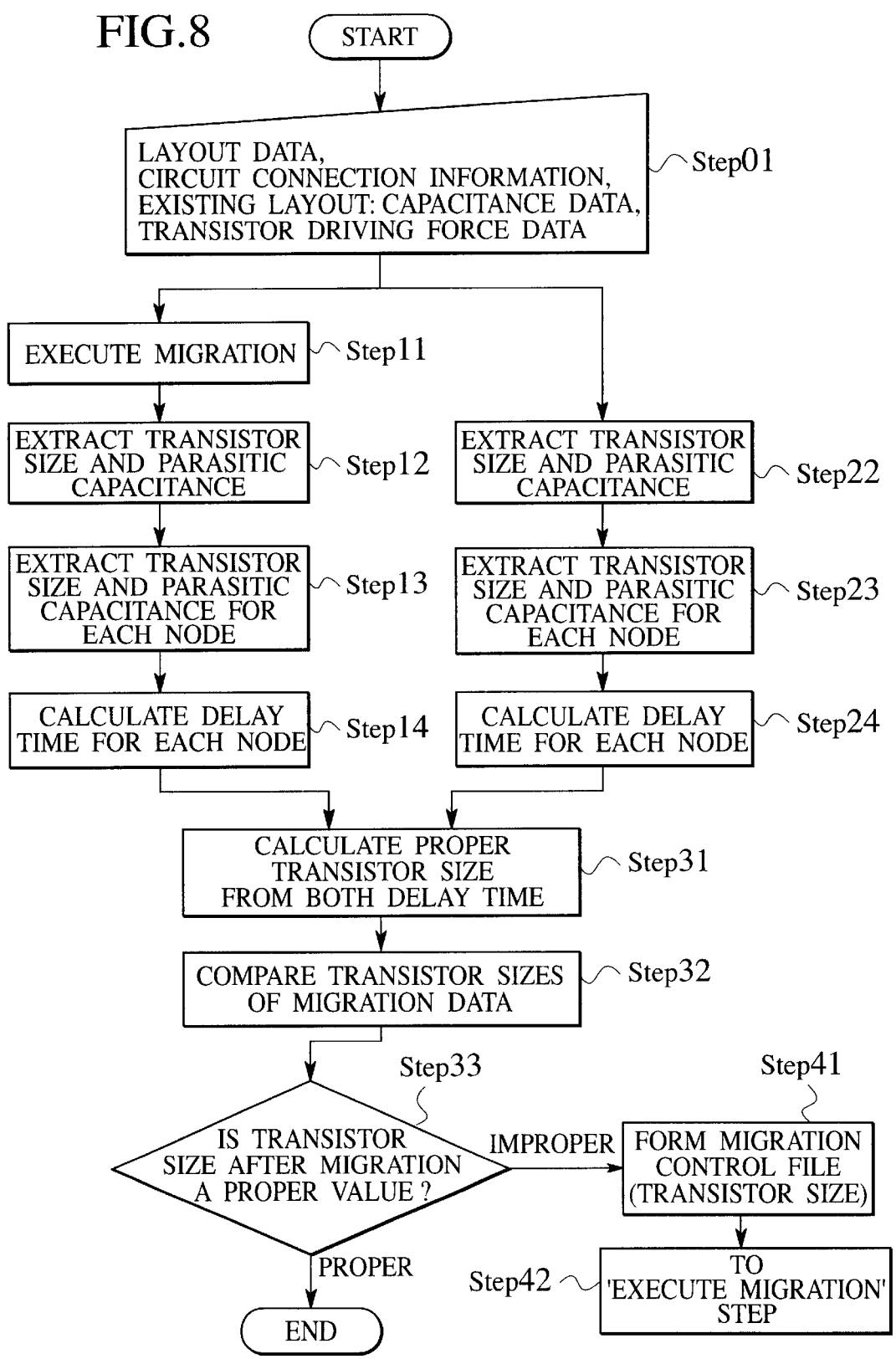
FIG. 8 is a flow chart showing a processing procedure flow for the LSI layout design apparatus shown in FIG. 4.

FIG. 8 is a flow chart showing a flow of a series of processing procedures carried out by the LSI layout design apparatus in this embodiment. It is noted that a series of processing procedures carried out by the LSI layout design apparatus in this embodiment can be stored in various types of recording mediums or transmitted through communication mediums and then distributed as an LSI layout design program which an electronic calculator or the like constituting the present layout design apparatus can execute. The operation of the electronic calculator realizing the LSI layout design apparatus is controlled by the above-stated LSI layout design program recorded on the recording medium. The electric calculator executes the following processings in accordance with predetermined processing procedures.

First, the following pieces of data are prepared as input data and inputted into the LSI layout design apparatus (in a Step 01):

(1) layout pattern data 10 (data 10a before migration);
(2) control file 21;
(3) extraction control file 23;
(4) circuit connection information 24;
(5) transistor driving force data (data 62a before migration; 62b after migration); and
(6) transistor control file 70.

Next, the calculator reads the layout pattern data 10 and the control file 21 and executes process migration using the process migration tool 20 (in a Step 11).

Then, the calculator reads the layout database 22 after the migration formed in the Step 11, the extraction control file 23 and the circuit connection information 24 and executes the following procedures using the layout parameter extraction tool 30. The layout parameter extraction tool 30 establishes the cross-reference between the layout and the circuit connection information based on signal names, obtains the wiring capacitance loads, the device parasitic capacitances and sizes of transistors or the like corresponding to the respective nodes, and the like, and forms a database (in a Step 12).

Next, using the data extraction tool 40 for each node, the calculator extracts the wiring parasitic capacitance, the device parasitic capacitances and drive transistor size for each node from the database formed in the Step 12 and forms a database including the extracted elements (in a Step 13).

The device parasitic capacitance CLm and the drive transistor size Wm for each node are extracted from the database formed in the Step 13 and delay time Tpdm for each node is calculated using the formula (3). In the calculation, the driving current value Idm of the corresponding transistor is read from the transistor driving force database 65a (in a Step 14).

Meanwhile, the layout parameter extraction tool 30a is executed based on the existing layout pattern data 10a, the extraction control file 23 and the circuit connection information 24. The tool 30a establishes the cross-reference between the layout of the existing circuit and the circuit connection information based on signal names, obtains the wiring capacitance loads, the device parasitic capacitance values and sizes of transistors or the like corresponding to the respective nodes, and the like, and forms a database (in a Step 22).

Further, the data extraction tool 40a for each node extracts wirings, a device parasitic capacitance and a drive transistor size for each node from the database formed in the Step 22 and forms a database including the extracted elements (in a Step 23).

Then, the device parasitic capacitance CLr and drive transistor size Wr for each node are extracted from the database formed in the Step 23 and delay time Tpdr for each node is calculated using the formula (2). In the calculation, the driving current value Idr of the corresponding transistor is read from the transistor driving force database 65a (in a Step 24).

It is noted that one of the procedures of Step 11 to Step 14 and those of Step 22 to Step 24 may be executed and then the other procedures may be executed, or they may be executed simultaneously.

Next, the optimum value Wo after the migration is calculated in order that the delay time Tpdr before the migration becomes equal to the delay time Tpdm after the migration thus calculated (in a Step 31).

Then, the transistor size Wm after the migration is compared with the calculated optimum value Wo and determined based on the comparison (in Step 32 to Step 33). Here, if all transistor devices satisfy the predetermined standard for the optimum transistor size, a series of procedures is finished.

However, if there is a transistor device which does not satisfy the predetermined optimum standard, the migration control file 70, in which the change of the transistor size to the optimum transistor size value Wo is described, is formed (in a Step 41) and the process migration processing starting in the Step 11 is executed again, thereby adjusting the size of the transistor in order that operation timing of each node after the migration becomes equal to the operation timing of the node which has been optimized before the migration (in a Step 42).

As stated so far, the operation timing of each node on the circuit layout before the process migration is obtained from the relationship between the driving current value and the parasitic capacitance value for the size of a transistor driving the node. Likewise, the operation timing of each node on the circuit layout after the process migration is obtained from the relationship between the driving current value and the parasitic capacitance value for the size of a transistor driving the node. The transistor size after the migration is optimized in order that the operation timing of each node before the migration becomes equal the operation timing of the node after the migration. As a result, it is possible to correct the shift of the capacitance relationship after the migration and to secure the operation timing of each node after the migration.

That is, the shift of the capacitance relationship after the migration is corrected by adjusting the transistor size so as to be equal to the optimized transistor size before the migration, it is possible to secure the operation timing of each node.

Furthermore, by setting delay time before the migration used as an optimization standard to be shorter than actual delay time, it is possible to realize optimizations including further shortening the delay time after the migration and accelerating the overall speed of the semiconductor integrated circuit apparatus.

Additional advantage and modifications will readily occur to those skilled in the art. Therefore, the invention in its broader aspects is not limited to the specific details and described herein.

What is claimed is:

1. An LSI layout design apparatus comprising:
a processing migration section conducting process migration for converting a first layout data according to a first design standard into a second layout data according to a second design standard and a designated transistor size;
an extraction section extracting transistor sizes and parasitic capacitances from the first layout data and the second layout data, respectively, for each node;
a delay time calculation section calculating a first delay time from the transistor size and the parasitic capacitance extracted from the first layout data and a driving current value of a transistor based on the first design standard, and calculating a second delay time from the transistor size and the parasitic capacitance extracted from the second layout data and a driving current value of a transistor based on the second design standard; and
an optimum value calculation section calculating an optimum value of the transistor size after the process migration in order that the second delay time becomes equal to the first delay time, wherein:
said first delay time is calculated from a formula $$Tpdr = CLr/(Idr \cdot Wr)$$

where Tpdr is the first delay time, CLr is the parasitic capacitance extracted from the first layout data, Idr is the driving current per unit width of the transistor based on the first design standard, and Wr is the transistor size extracted from the first layout data; and
said second delay time is calculated from a formula $$Tpdm = CLm/(Idm \cdot Wm)$$

where Tpdm is the second delay time, CLm is the parasitic capacitance extracted from the second layout data, Idm is the driving current per unit width of the transistor based on the second design standard, and Wm is the transistor size extracted from the second layout data.

2. The LSI layout design apparatus according to claim 1, wherein
said optimum value of the transistor size is derived from a transistor size Wm satisfying a formula $$Tpdr = Tpdm$$

where Tpdr is the first delay time and Tpdm is the second delay time.

3. The LSI design apparatus according to claim 1, wherein said optimum value calculation section sets said first delay time at a value lower than an actual value, and calculates said optimum value.

4. The LSI layout design apparatus according to claim 1, further comprising:
an optimization section comparing the transistor size extracted from said second layout data with said optimum value to obtain a differential value, and outputting the optimum value of the transistor size calculated by said optimum value calculation section if said differential value as a result of comparison is out of a predetermined range;
wherein said process migration section conducts the process migration again based on the optimum value of the transistor size outputted from said optimization section.

5. An LSI layout design method comprising:
conducting process migration for designating a transistor size, and converting a first layout data according to a first design standard into a second layout data according to a second design standard;
extracting a transistor size and a parasitic capacitance for each node from the first layout data;
calculating a first delay time from the transistor size and the parasitic capacitance extracted from the first layout data and a driving force of a transistor based on the first design standard;
extracting a transistor size and a parasitic capacitance for each node from the second layout data;
calculating a second delay time from the transistor size and the parasitic capacitance extracted from the second layout data and a driving force of a transistor based on the second design standard;
calculating an optimum value of the transistor size after the process migration in order that the second delay time becomes equal to the first delay time;
comparing the transistor size extracted from the second layout data with the optimum value, and obtaining a differential value; and
executing the process migration again based on the calculated optimum value of the transistor size if the differential value obtained as a result of comparison is out of a predetermined range, wherein:
said first delay time is calculated from a formula $$Tpdr = CLr/(Idr \cdot Wr)$$

where Tpdr is the first delay time, CLr is the parasitic capacitance extracted from the first layout data, Idr is the driving current per unit width of the transistor based on the first design standard, and Wr is the transistor size extracted from the first layout data; and
said second delay time is calculated from a formula $$Tpdm = CLm/(Idm \cdot Wm)$$

where Tpdm is the second delay time, CLm is the parasitic capacitance extracted from the second layout data, Idm is the driving current per unit width of the transistor based on the second design standard, and Wm is the transistor size extracted from the second layout data.

6. The LSI layout design method according to claim 5, wherein
said optimum value of the transistor size is derived from a transistor size Wm satisfying a formula $$Tpdr = Tpdm$$

where Tpdr is the first delay time and Tpdm is the second delay time.

7. The LSI layout design method according to claim 5, wherein
in said calculation of said optimum value, said first delay time is set at a value lower than an actual value and said optimum value is calculated.

8. An LSI layout design program stored in a computer readable recording medium, said LSI layout design program comprising:
conducting process migration for designating a transistor size, and converting a first layout data according to a first design standard into a second layout data according to a second design standard;

extracting a transistor size and a parasitic capacitance for each node from the first layout data;

calculating a first delay time from the transistor size and the parasitic capacitance extracted from the first layout data and a driving force of a transistor based on the first design standard;

extracting a transistor size and a parasitic capacitance for each node from the second layout data;

calculating a second delay time from the transistor size and the parasitic capacitance extracted from the second layout data and a driving force of a transistor based on the second design standard;

calculating an optimum value of the transistor size after the process migration in order that the second delay time becomes equal to the first delay time;

comparing the transistor size extracted from the second layout data with the optimum value, and obtaining a differential value; and executing the process migration again based on the calculated optimum value of the transistor size if the differential value obtained as a result of comparison is out of a predetermined range, wherein:

said first delay time is calculated from a formula $$Tpdr = CLr/(Idr \cdot Wr)$$

where Tpdr is the first delay time, CLr is the parasitic capacitance extracted from the first layout data, Idr is the driving current per unit width of the transistor based on the first design standard, and Wr is the transistor size extracted from the first layout data; and said second delay time is calculated from a formula $$Tpdm = CLm/(Idm \cdot Wm)$$

where Tpdm is the second delay time, CLm is the parasitic capacitance extracted from the second layout data, Idm is the driving current per unit width of the transistor based on the second design standard, and Wm is the transistor size extracted from the second layout data.

9. The recording medium according to claim 8, said LSI layout design program wherein said optimum value of the transistor size is derived from a transistor size Wm satisfying a formula $$Tpdr = Tpdm$$

where Tpdr is the first delay time and Tpdm is the second delay time.

10. The recording medium according to claim 8, said LSI layout design program wherein in said calculation of said optimum value, said first delay time is set at a value lower than an actual value and said optimum value is calculated.

11. A semiconductor integrated circuit designed by using an LSI layout design method, said LSI layout design method comprising:

conducting process migration for designating a transistor size, and converting a first layout data according to a first design standard into a second layout data according to a second design standard;

extracting a transistor size and a parasitic capacitance for each node from the first layout data;

calculating a first delay time from the transistor size and the parasitic capacitance extracted from the first layout data and a driving force of a transistor based on the first design standard;

extracting a transistor size and a parasitic capacitance for each node from the second layout data;

calculating a second delay time from the transistor size and the parasitic capacitance extracted from the second layout data and a driving force of a transistor based on the second design standard;

calculating an optimum value of the transistor size after the process migration in order that the second delay time becomes equal to the first delay time;

comparing the transistor size extracted from the second layout data with the optimum value, and obtaining a differential value; and executing the process migration again based on the calculated optimum value of the transistor size if the differential value obtained as a result of comparison is out of a predetermined range, wherein:

said first delay time is calculated from a formula $$Tpdr = CLr/(Idr \cdot Wr)$$

where Tpdr is the first delay time, CLr is the parasitic capacitance extracted from the first layout data, Idr is the driving current per unit width of the transistor based on the first design standard, and Wr is the transistor size extracted from the first layout data; and said second delay time is calculated from a formula $$Tpdm = CLm/(Idm \cdot Wm)$$

where Tpdm is the second delay time, CLm is the parasitic capacitance extracted from the second layout data, Idm is the driving current per unit width of the transistor based on the second design standard, and Wm is the transistor size extracted from the second layout data.

12. The semiconductor integrated circuit according to claim 11, said LSI layout design method wherein in said calculation of said optimum value, said first delay time is set at a value lower than an actual value and said optimum value is calculated.

13. The semiconductor integrated circuit according to claim 11, wherein said optimum value of the transistor size is derived from a transistor size Wm satisfying a formula $$Tpdr = Tpdm$$

where Tpdr is the first delay time and Tpdm is the second delay time.

* * * * *